(12) United States Patent
Popescu

(10) Patent No.: US 10,976,390 B2
(45) Date of Patent: Apr. 13, 2021

(54) SENSOR AND MAGNETIC RESONANCE TOMOGRAPHY UNIT WITH WIRELESS NEAR FIELD TRANSMISSION OF ENERGY AND DATA

(71) Applicant: Siemens Healthcare GmbH, Erlangen (DE)

(72) Inventor: Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 10 days.

(21) Appl. No.: 16/435,706

(22) Filed: Jun. 10, 2019

(65) Prior Publication Data
US 2019/0377043 A1  Dec. 12, 2019

(30) Foreign Application Priority Data
Jun. 12, 2018  (EP) ...................... 8177237

(51) Int. Cl.
*G01R 33/36* (2006.01)
*G01R 33/341* (2006.01)

(52) U.S. Cl.
CPC ....... *G01R 33/3692* (2013.01); *G01R 33/341* (2013.01)

(58) Field of Classification Search
CPC .............. G01R 33/3692; G01R 33/341; G01R 33/3635; G01R 33/3415; G01R 33/34084; G01R 33/36; G01R 33/385; A61B 5/055
See application file for complete search history.

(56) References Cited

U.S. PATENT DOCUMENTS

| | | | |
|---|---|---|---|
| 4,694,836 A | 9/1987 | Buikman | |
| 7,309,989 B2 | 12/2007 | Boskamp | |
| 7,417,433 B2 | 8/2008 | Heid | |
| 8,283,927 B2 | 10/2012 | Cork | |
| 8,502,540 B2 | 8/2013 | Nakanishi | |
| 8,604,791 B2* | 12/2013 | Vaughan, Jr. | G01R 33/3415 324/318 |
| 9,517,021 B2* | 12/2016 | Anderson | A61B 5/0002 |
| 2012/0313645 A1 | 12/2012 | Biber | |

(Continued)

FOREIGN PATENT DOCUMENTS

| | | |
|---|---|---|
| DE | 3446717 A1 | 6/1986 |
| DE | 102007053483A1 A1 | 5/2009 |

(Continued)

OTHER PUBLICATIONS

European Search Report for European Patent Application No. 18177237.7-1022 dated Jan. 3, 2019.

*Primary Examiner* — Susan S Lee
(74) *Attorney, Agent, or Firm* — Lempia Summerfield Katz LLC

(57) ABSTRACT

Embodiments relate to a sensor for use in a magnetic resonance tomography unit and to a system including of a magnetic resonance tomography unit and a sensor. The sensor includes an energy supply device, a data transmission device and a first resonant antenna. The first resonant antenna includes a signal connection to the data transmission device and/or the energy supply device. A significant mismatch of the first resonant antenna exists between the impedance of the signal connection and the impedance of the first resonant antenna in free space at a first resonant frequency.

12 Claims, 5 Drawing Sheets

(56) References Cited

U.S. PATENT DOCUMENTS

2014/0292339 A1 10/2014 Albsmeier
2014/0361769 A1 12/2014 Hardie
2018/0356478 A1 12/2018 Reykowski
2019/0049533 A1 2/2019 Popescu

FOREIGN PATENT DOCUMENTS

DE 102010019058A1 A1 11/2011
DE 102011076918 A1 12/2012
DE 102013205464A1 A1 10/2014
WO WO2017093873 A1 6/2017

* cited by examiner

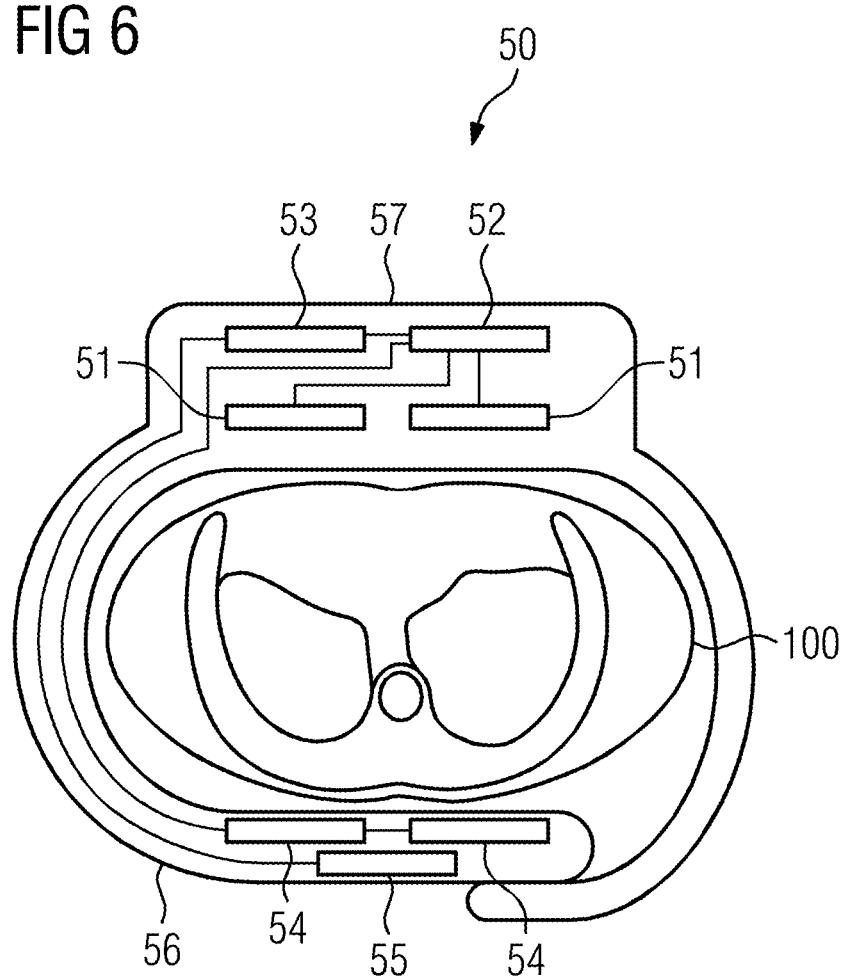

SENSOR AND MAGNETIC RESONANCE TOMOGRAPHY UNIT WITH WIRELESS NEAR FIELD TRANSMISSION OF ENERGY AND DATA

CROSS REFERENCE TO RELATED APPLICATIONS

This application claims the benefit of EP18177237.7, filed on Jun. 12, 2018, which is hereby incorporated by reference in its entirety.

FIELD

Embodiments relate to a sensor and to a magnetic resonance tomography unit with a wireless transmission of energy and/or data between the two.

BACKGROUND

Magnetic resonance tomography units are imaging devices that, for imaging an examination object, align nuclear spins of the examination object with a strong external magnetic field and excite them by a magnetic alternating field for precession about the alignment. The precession or return of the spins from the excited state into a state with lower energy in its turn generates a magnetic alternating field, also referred to as a magnetic resonance signal, as a response, that is received via antennas.

With the aid of magnetic gradient fields, a spatial encoding, that makes it possible to assign the received signal to a volume element, is impressed on the signals. The received signal is then evaluated and a three-dimensional imaging presentation of the examination object is provided. The presentation created specifies a spatial density distribution of the spins.

Since the magnetic resonance signals are very weak, receive antennas, e.g. local coils, may be arranged as close as possible to the region to be examined. For transmission of the received signals and for supplying power to pre-amplifiers and signal processing in the local coils, cable connections to the magnetic resonance tomography unit may be used that are susceptible to faults, complicated to handle and not least dangerous for the patient through the sheath currents caused by the excitation pulses on the conductors, at least when corresponding blocking filters are to be omitted.

There have therefore long been efforts to provide the local coils with wireless transmission technology. In such cases, however, wireless transmission technology is susceptible to faults, e.g. through interferences, supplying power to the local coils by batteries may lead with constant use to interruptions for charging the batteries, and the radio waves used may disrupt the magnetic resonance recording.

Other sensors are also used in conjunction with the magnetic resonance tomography unit, for example EEG (Electro Encephalogram), EKG (Electrocardiogram) or breathing sensors, that capture physiological data during the imaging and are also used in some cases for controlling the imaging and require an energy supply.

If the energy supply is provided wirelessly, via the body coil for example, the power required may heat up the patient and reduce the power budget available for recording.

BRIEF SUMMARY AND DESCRIPTION

The scope of the present invention is defined solely by the appended claims and is not affected to any degree by the statements within this summary. The present embodiments may obviate one or more of the drawbacks or limitations in the related art.

Embodiments provide a sensor for a more secure and more reliable operation.

The sensor includes an energy supply device, a data transmission device and a first resonant antenna. An energy supply device is a device that is configured to supply active components of the sensor, such as for example pre-amplifiers, local oscillators, a controller, A/D converters and security components for a local coil, with energy. The energy supply unit receives the necessary energy by a wireless transmission between magnetic resonance tomography unit and sensor. The energy supply device may for example include rectifiers, smoothing capacitors, voltage regulators, or voltage converters. The energy supply device may include intermediate energy stores such as high-capacitance capacitors or rechargeable batteries to be able to compensate for periods without or with reduced wireless energy transmission as well as load peaks of the energy consumption in the sensor.

A data transmission device is configured to transmit data from the sensor to the magnetic resonance tomography unit and/or in the opposite direction by a wireless transmission using radio-frequency signals with a frequency of more than 1 MHz, 10 MHz, 100 MHz or 1 GHz. The data may be analog signals such as preamplified magnetic resonance signals, e.g. after a frequency conversion, that are modulated with amplitude or frequency modulation or another similar modulation technique onto the radio-frequency signals. The data may, however, also be digital, such as magnetic resonance signals after an A/D conversion. The data transmission device in the case of digital data may have a data buffer and use encoding methods that allow interruptions in transmission to be recognized and allow the data to be repeated thereafter.

The first resonant antenna includes a signaling connection to the data transmission device or the energy supply device. The signal connection may be a waveguide, for example, such as a coaxial cable, symmetrical conductor or a stub line. The signal connection provides radio-frequency signals to be conveyed from the data transmission device to the resonant antenna or in the opposite direction from the resonant antenna to the data transmission device or the energy supply device. An appreciable mismatch exists between the impedance of the signal connection and the impedance of the resonant antenna at a first resonant frequency in free space without any appreciable interaction with another antenna. The amount of the complex resistance of the signal connection and of the antenna at the connection point of the first resonant antenna at the first frequency may deviate for example by a factor 2, 5, 10 from one another. The standing wave ratio resulting from the mismatch may be greater than 2 or 3.

A mismatched antenna radiates only a small part of the power supplied to it into a free electromagnetic wave propagating in space. Instead, for example, a mismatched magnetic antenna such as an antenna coil as transmit antenna creates a local magnetic alternating field that falls away with third power of the distance out into the space. The energy switches from the signal connection into the magnetic near field and back.

If a resonant first resonant antenna is introduced into the near field, the antenna interacts with the transmit antenna and obtains energy from the (e.g. magnetic) alternating field, that may be supplied to a receiver for receiving data or to the energy supply device. Through the interaction of the first resonant antenna with the transmit antenna the impedance of the first resonant antenna also changes and conversely that of the transmit antenna, so that the mismatch during the energy transmission or data transmission in the near field significantly reduces or disappears entirely.

The sensor may be a local coil, but also a sensor for recording an EKG, EEG, breathing or other physiological data or measured values.

The mismatch between signal connection and resonant antenna makes sure that only energy is transmitted into a resonant antenna and there are no unnecessary radiation emissions, since the SAR load is increased by this. Moreover, a radio approval may also be simplified on account of the lower radiation.

The sensor includes a plurality of first antennas, that may be arranged in a planar manner next to one another. In this way it may be insured that, even with a lateral shift of the sensor e.g. on the patient couch, a first resonant antenna is always arranged in the local area of the third antenna(s) of the system.

In an embodiment, the system includes a magnetic resonance tomography unit and a sensor. The magnetic resonance tomography unit includes an energy transmission device and a third resonant antenna. An energy transmission device is a device that is capable of generating a radio-frequency signal with a resonant frequency of the third resonant antenna and a power sufficient to supply power to the sensor. The energy transmission device may have an oscillator and a final power transmission stage. The energy transmission device may modulate the radio-frequency signal for transmission of control signals and the energy supply device of the sensor may be configured to demodulate the modulated radio-frequency signal in order to evaluate and convert the control signals in the sensor.

Furthermore, the magnetic resonance tomography unit includes a data-receiving device. The data-receiving device is configured to receive data transmitted by the data transmission device. With analog data the receiving may include an amplification and demodulation for example. With a frequency multiplex it may moreover also include a demultiplexing. For digital data a decoding and where necessary an error correction is moreover conceivable.

The third resonant antenna includes a signal connection to the energy transmission device and/or the data-receiving device. The third resonant antenna includes a third resonant frequency, that essentially matches the first resonant frequency of the first antenna. An essential match is seen as a deviation of less than 5%, 1%, 0.5% or 0.1% of the third resonant frequency from the first resonant frequency. With the third resonant frequency there exists in free space without appreciable interaction with another antenna a significant mismatch between the impedance of the signal connection at the terminal point of the signal connection at the third resonant antenna and the impedance of the third resonant antenna with the third resonant frequency. For a significant mismatch what has already been described for the sensor applies.

Through the interaction of the first resonant antenna with the third resonant antenna the impedance of the first resonant antenna also increases and conversely of the third resonant antenna, so that the mismatch in the energy transmission or data transmission in the near field significantly reduces or disappears entirely.

The system provides the sensor, because of the mismatch in a near field of the third resonant antenna to be supplied with energy by the first antenna with energy or to transmit data, without radiating energy into the space to any great extent. Moreover, the proximity leads to where the signal level is greater and the resistance to noise and also the signal-to-noise ratio (SNR) is greater.

In an embodiment, the sensor includes a second resonant antenna. The first resonant antenna includes a signal connection to the energy supply device and the second resonant antenna to the data transmission device. The first resonant frequency of the first antenna differs significantly from the second resonant frequency of the second antenna. The deviation may amount to more than 5%, 10% or 20%, the two antennas may operate in different frequency bands such as MHz and GHz, so that the resonant frequencies differ by orders of magnitude. In such cases the lower frequency may be used for the energy transmission to the energy supply device with the first antenna, since the bandwidth for data transmission is greater at higher frequencies.

A significant mismatch between the impedance of the signal connection and the impedance of the second resonant antenna exists for the first resonant antenna at the first resonant frequency and the second resonant antenna at the second resonant frequency. What has already been stated applies to the significant mismatch.

The mismatch allows the second resonant antenna, as well as energy transmission, also to undertake data transmission independently and without emitting energy into the space.

In an embodiment, the first resonant antenna includes a signal connection to the energy supply device and to the data transmission device. The first resonant antenna includes a first resonant frequency and second resonant frequencies different therefrom, the first antenna thus involves a dual-resonant antenna. This may be achieved for example by a resonance element for two different frequencies being provided in a conductor loop of an antenna. For the double-resonant first resonant antenna, the first resonant antenna includes a significant mismatch between the impedance of the signal connection and the impedance of the resonant first antenna at the first resonant frequency and the second resonant frequency.

The double-resonant antenna provides for the use of a single antenna for the near field transmission of energy and data.

In an embodiment, the data transmission device is configured to modulate an energy taken from the first antenna. The data transmission device includes a signal connection to the energy supply device, so that the data transmission device may control how much energy is obtained from the first resonant antenna. On a transmit side in the magnetic resonance tomography unit the different power draws from the field may be detected and the transmitted data signal may be demodulated.

A data transmission may be realized without the sensor having to include a separate transmitter and without emission of additional radio signals.

In an embodiment, the sensor includes a first envelope. The first envelope may be, for example, a rigid housing or a flexible and possibly also compressible envelope, in order to adapt the sensor to the body and also to be able to arrange the sensor under the patient. The first resonant antenna and/or second resonant antenna are arranged adjacent to the envelope on one side of the sensor, that, when the sensor is operating in accordance with the application, faces away from a patient. The envelope may be arranged on the inner side of the envelope in such a way that it is at the smallest possible distance from the third antenna of the magnetic resonance tomography unit, that is transmitting energy via the near field and/or is transmitting or receiving data.

In an arrangement of the antenna on or in the envelope provides a short distance to a transmit antenna of the magnetic resonance tomography unit to be achieved, that provides an effective transmission of energy and/or data.

In an embodiment, the sensor includes a first envelope and a second envelope separate from the first envelope of the sensor. The first and/or second resonant antenna is arranged in the second envelope. The second envelope is connected to the first envelope with an electrical lead, so that the first and/or second resonant antenna is electrically linked to the energy supply device and/or the data transmission device. The second envelope may also fulfill an additional function, for example may serve as an attachment belt or attachment for the sensor on the patient or the patient couch.

The first or second resonant antenna arranged in the second envelope provides the sensor to be arranged largely independent of the location of a third antenna of the magnetic resonance tomography unit on the patient, without endangering the energy and/or data transmission.

In an embodiment, the data transmission device is configured to transmit data in a frequency range above a Larmor frequency of the magnetic resonance tomography unit. The Larmor frequency is defined as the resonant frequency of the nuclear spins to be acquired by the magnetic resonance tomography unit for the imaging in the magnetic field B0 of the field magnets of the magnetic resonance tomography unit. If for example the field strength of the field magnets is 3 T and the nuclear spins of hydrogen atoms are acquired, then the Larmor frequency is at around 123 MHz. The data transmission device is then configured for example, by oscillators, filters and antennas, to transmit data in a frequency range of 140 MHz to 240 MHz. Because of the large bandwidth the first antennas are configured as non-resonant. This is achieved for example by there being a mismatch between the impedance of the signal connection between data transmission device and the first antenna and the impedance of the first resonant antenna in free space at a first resonant frequency of the first resonant antenna.

S sufficient bandwidth for transmission of the magnetic resonance signals is produced by this in the frequency range. At the same time, however, the wavelengths are so large that, with the distances in the patient tunnel, there is still a near field coupling between first and third antenna with almost negligible emission of free radio waves.

In an embodiment, the data transmission device is configured to use a multi-carrier transmission method. A multi-carrier transmission method is a transmission method that divides up the information of the data to be transmitted between a plurality of different carrier frequencies, that are distributed over the frequency range previously explained. For example, OFDM (Orthogonal Frequency Division Multiplex) may be used, A multi-carrier transmission method makes a large information bandwidth available and, in doing so, may compensate for the different attenuations for the individual carrier frequencies, for example by the frequency response of the wideband antennas.

In an embodiment, the third resonant antenna is arranged in an area of the magnetic resonance tomography unit that, when the sensor is used as per application, is located in the immediate vicinity of the first resonant antenna. For example the third resonant antenna may be arranged in a patient couch in the area of the back of a patient, so that for example a spine coil includes a corresponding first and/or second resonant antenna on the underside (inside the housing or envelope), so that the first resonant antenna and/or second resonant antenna interact with a near field of the third resonant antenna. A third resonant antenna may be in or behind cladding of the patient tunnel, or also below a patient couch.

An optimal energy transfer and exchange of data is provided by the corresponding arrangement of the antennas opposite one another in sensor and magnetic resonance tomography unit.

In an embodiment, when used according to application, the surfaces of a housing of the magnetic resonance tomography unit and an envelope of the sensor lying between the third resonant antenna and the first resonant antenna are shaped to be complementary to one another in such a way that a distance between the third resonant antenna and the first resonant antenna is minimal. For example, both housing surfaces may be configured flat, or one concave and the other convex. A patient couch may include a flat or concave surface and the envelope of the sensor is flexible, so that the sensor may be pressed onto the patient couch below the patient.

A corresponding shape of the envelope of the sensor and surface of the magnetic resonance tomography unit provides a minimum distance and an optimal energy and data transfer.

In an embodiment, the system includes a plurality of first resonant antennas and/or second resonant antennas and third resonant antennas. The plurality of the first resonant antennas and/or second resonant antennas are arranged flat on the envelope of the sensor and the third resonant antennas flat on the surface of the magnetic resonance tomography unit, so that, when the sensor is arranged according to the application on the patient, a plurality of first resonant antennas and/or second resonant antennas are each located in the local area of a plurality of third resonant antennas. The data transmission device and the data-receiving device may be configured to use the same transmission frequencies on different pairs of first resonant antennas and third resonant antennas at the same time for the transmission of different information. Such a transmission method is also referred to as MIMO (multiple input/multiple output).

The flat arrangement of the antennas on the opposite faces of the envelope or surface provides that there are always a few pairs of first/second antennas and third antennas opposite one another and in this way a continuous transport of energy and/or data is insured. At the same time the spatial distribution also makes it possible to use carrier frequencies on different antenna pairs multiple times and in this way to increase the information bandwidth.

BRIEF DESCRIPTION OF THE FIGURES

FIG. 6 depicts an example of a form of embodiment of a local coil, in which the antenna coil, the first resonant antenna and the second resonant antenna are spatially separated.

DETAILED DESCRIPTION

Figure 1:
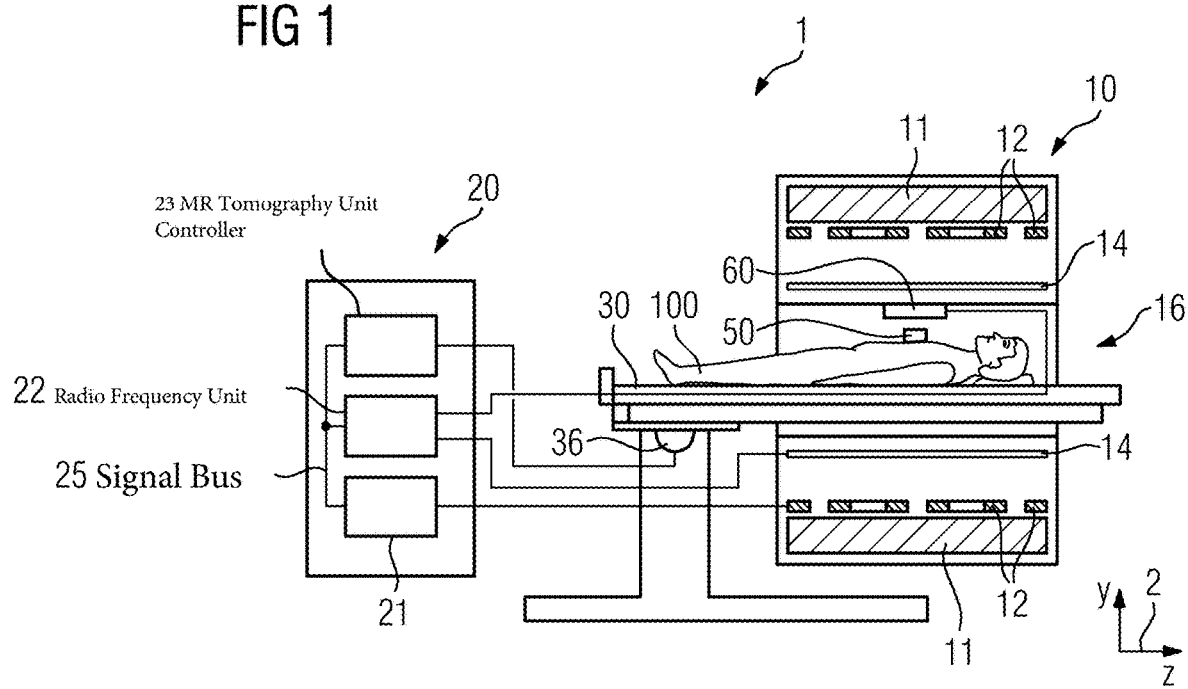
FIG. 1 depicts an example of a schematic diagram of a magnetic resonance tomography unit with a local coil according to an embodiment.

FIG. 1 depicts a schematic diagram of a form of embodiment of a magnetic resonance tomography unit 1 with a local coil 50.

The magnet unit 10 includes a field magnet 11, that generates a static magnetic field B0 for alignment of nuclear spins of samples or patients 100 in a recording region. The recording region is arranged in a patient tunnel 16, that extends in a longitudinal direction 2 through the magnet unit 10. A patient 100 is able to be moved by the patient couch 30 and the drive unit 36 of the patient couch 30 into the recording region. The field magnet 11 involves a superconducting magnet, that may provide magnetic fields with a magnetic flux density of up to 3T, with the very latest devices of even more. For lower field strengths however permanent magnets or electromagnets with normally conducting coils may be employed.

The magnet unit 10 furthermore includes gradient coils 12, that are configured, for spatial differentiation of the recorded imaging regions in the examination volume, to superimpose variable magnetic fields in three spatial directions on the magnetic field B0. The gradient coils 12 may be coils made of conducting wires, that may generate fields orthogonal to each other in the examination volume.

The magnet unit 10 likewise includes a body coil 14, that is configured to radiate a radio-frequency signal supplied via a signal line 33 into the examination volume and to receive resonant signals emitted by the patient 100 and output them via a signal line. The body coil 14 may be replaced, for sending out the radio-frequency signals and/or receiving them, by the local coil 50, that is arranged in the patient tunnel 16 close to the patient 100. The local coil 50 may be configured for sending and receiving and therefore a body coil 14 may be omitted.

A control unit 20 supplies the magnet unit 10 with the various signals for the gradient coils 12 and the body coil 14 and evaluates the received signals. A magnetic resonance tomography unit controller 23 coordinates the subunits.

Thus, the control unit 20 includes a gradient control 21, that is configured to supply the gradient coils 12 via supply leads with variable currents, that provide the desired gradient fields coordinated in time in the examination volume.

The control unit 20 furthermore includes radio-frequency unit 22, that is configured to generate a radio-frequency pulse with a predetermined timing curve, amplitude and spectral power distribution to excite a magnetic resonance of the nuclear spins in the patient 100. Pulse powers in the range of kilowatts may be achieved. The individual units are linked to one another via a signal bus 25.

The radio-frequency signal generated by the radio-frequency unit 22 is conveyed via a signal connection to the body coil 14 and emitted into the body of the patient 100, in order to excite the nuclear spins there. An emission of the radio-frequency signal via one or more coil windings of the local coil 50 is also possible.

The local coil 50 receives a magnetic resonance signal from the body of the patient 100 since, because of the short distance, the signal-to-noise ratio (SNR) of the local coils 50 is better than a receipt by the body coil 14. The MR signal received by the local coil 50 is prepared in the local coil 50 and forwarded to the radio-frequency unit 22 of the magnetic resonance tomography unit 1 for evaluation and image acquisition.

The signal connection between local coil 50 and magnetic resonance tomography unit 1 is wireless, at least between the local coil 50 and the antenna unit 60. The special features of the wireless connection will be discussed in greater detail in the description of the subsequent figures. The arrangement of the local coil 50 on the patient 100 and of the antenna unit 60 in the patient tunnel 16 is only chosen by way of example and for reasons of clarity of the drawing. In an embodiment depicted in FIG. 4, the local coil 50 is provided below the patient 100 and the antenna unit 60 in the patient couch 30. The antenna unit 60 may be arranged in or under cladding of the patient tunnel 16. Energy is supplied to the local coil 50 at least part of the time by electromagnetic interaction with the antenna unit 60. The signal from the magnetic resonance tomography unit 1 to the local coil 50 is generated by the radio-frequency unit 22, that also receives and evaluates signals from the local coil 50 via the antenna unit 60 in the opposite direction.

Other sensors, for example for acquisition of physiological data such EEG, EKG or breathing, are also used in conjunction with a magnetic resonance tomography unit. With a breathing sensor or an EKG for example the imaging may be synchronized with the movement of the organs, in order to minimize image artifacts caused by movement. The sensors too, like the local coil 50 shown to represent them, may receive or transmit energy and/or data from the magnetic resonance tomography unit wirelessly. In embodiments described below and, in the FIGS., a local coil 50 is depicted in each case, where the information given for this is also applicable in each case to the other types of sensors.

Figure 2:
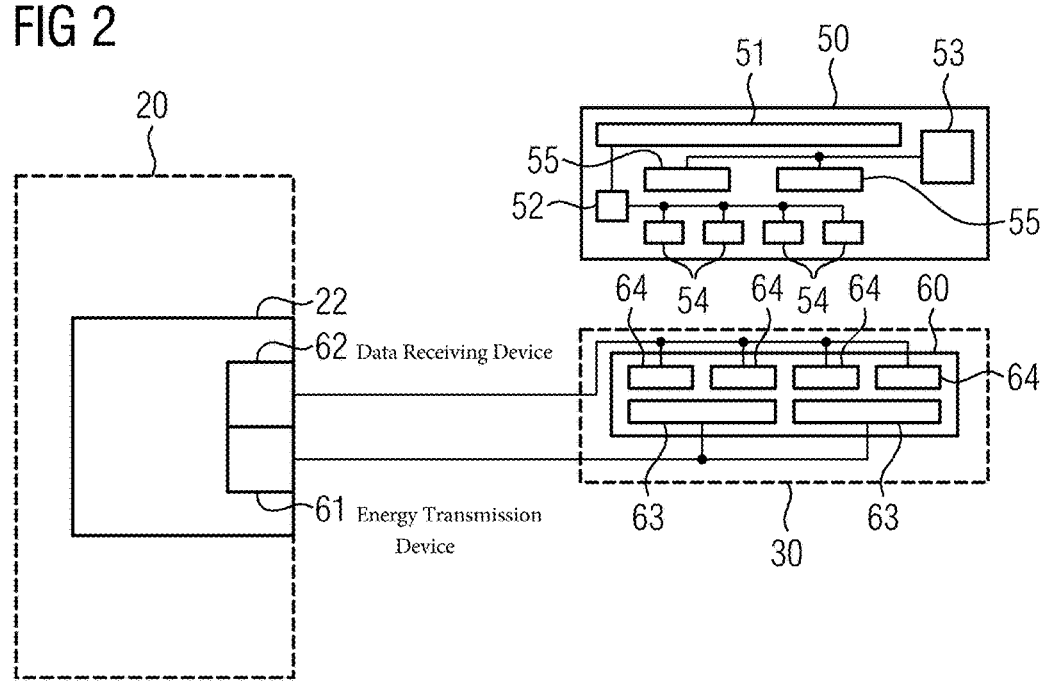
FIG. 2 depicts an example of a schematic diagram of an antenna unit and radio-frequency unit of the magnetic resonance tomography unit and of a local coil according to an embodiment.

Depicted in FIG. 2 is an example of a schematic diagram of an antenna unit 60 and radio-frequency unit 22 of the magnetic resonance tomography unit 1 and of a local coil 50. The ratios of the sizes in the figure are not true-to-scale.

The radio-frequency unit 22 includes an energy transmission device 61, that for example includes an oscillator and a power amplifier. The energy transmission device 61 is configured, with the aid of the antenna unit 60, to generate a magnetic alternating field, via which the local coil 50 may be supplied wirelessly with energy.

In an embodiment, the radio frequency unit 22 also includes a data-receiving device 62, that is configured to receive and to evaluate a wireless data signal of the local coil 50 via the antenna unit 60. The data receiving device 62 may also be configured to transmit data to the local coil for control or that the radio-frequency unit 22 may also include its own data transmission device.

The radio-frequency unit 22 is linked to the antenna unit 60 via one or more signal connections. The signal connection is configured to convey the radio-frequency signal generated by the energy transmission device 61 to one or more third antennas 63. The signal connection may for example be a coaxial line or a symmetrical line (twisted pair, stub line) with a defined wave impedance, so that a signal or also a number of signals with different frequency may be conveyed via the signal connection to the antenna unit 60. In an embodiment one signal may be transmitted for energy supply at one frequency and another signal for control at another frequency. The energy transmission device may modulate the radio-frequency signal and may transmit a control signal from the control unit 20 to the local coil 50 in this way.

The third resonant antenna 63 is essentially mismatched, so that the antenna generates only one radio-frequency near field, in the case of a transmit coil as the third resonant antenna 63, a predominantly magnetic alternating field in the near field, without energy being emitted to any great extent as an electromagnetic wave into the space. For example, the emitted energy may be less than 20%, 10%, 5% or 1% of that supplied via the signal connection. The remaining energy is reflected and temporarily stored for example in the signal connection or supply line.

The mismatch of the third resonant antenna 63 may on the one hand be achieved by the input impedance of the third resonant antenna 63 having a significantly differently value from the impedance of the signal connection at the connection point. For example, a coaxial cable as signal connection may have an impedance of 50 Ohm, whereas a radiating antenna with far field includes a free air impedance von 377 Ohm. The input impedance of the third resonant antenna 63 may be varied for example via the surface enclosed, the number of coil windings or by tuning capacitors.

In an embodiment, the antenna unit includes one or more adapter elements, that create a mismatch through the configuration of the components, i.e. as "mis"adaptation elements. This may be achieved for example with a suitable choice of the capacitances and inductances of a Pi element which enables a commercially-available cable to be used as a signal connection, where through the correct matching of the impedances at the two end points by the energy transmission device and of the adapter elements on the side towards the cable, the length of the cable may be different.

In another embodiment, the signal connection may have a predefined length and thereby itself act as a transformer or adapter element and to transform an impedance at the energy transmission device at one end of the cable to an unmatched impedance value at the connection point of the antenna. For example, a line with a length that corresponds to a quarter of the wavelength on the line, transforms a very high impedance (open line) to an extremely low impedance (short circuit) at its other end. In this way a separate adapter element in the antenna unit 60 may be dispensed with.

In an embodiment, the antenna unit 60 includes a fourth resonant antenna 64, that is connected via a signal connection to the data receiving device 62 of the radio-frequency unit 22. The data receiving device 62 is configured to receive a magnetic resonance signal from the local coil via the fourth resonant antenna 64. The magnetic resonance signal may be analog and may be converted as such to another frequency, modulated in amplitude or frequency modulation on a carrier wave or also transmitted at the same time as magnetic resonance signals of other antenna coils of the local coil via frequency multiplex or time-division multiplex. However, a transmission of digitized magnetic resonance signals is also possible, that may then be transmitted in their entirety by buffering and error correction, even with brief interruptions to the connection.

The fourth resonant antenna 64 may also be mismatched. Even if, on account of the higher bandwidth, higher frequencies than for the energy transmission are used, what has already been stated for the energy transmission and the third resonant antenna 63 applies for the mismatch. Only the dimensioning of the components differs.

For a transmission of control commands in the opposite direction from the magnetic resonance tomography unit 1 to the local coil 50 via the antenna unit 60, as already explained, the magnetic alternating field used for energy transmission may be modulated or there may also be bidirectional traffic of the fourth resonant antenna 64 from the data receiving device.

FIG. 2 depicts a local coil 50. The local coil 50 includes one or more antenna coils 51, that are configured to receive a magnetic resonance signal from the body of the patient 100. The received magnetic resonance signals are prepared for transmission by a data transmission device 52. There may be first an amplification by a low-noise preamplifier (LNB). For an analog transmission the magnetic resonance signal may be converted to another frequency by mixing it with a local oscillator signal or may be impressed on a carrier with amplitude modulation or frequency modulation or with another modulation method. Also possible is a frequency multiplex of a number of signals. For a digitized transmission there is first an analog-digital conversion, before the digitized signal is modulated onto a carrier. The same modulation method as for analog transmission may be used here or also specific digital methods such as for example quadrature modulation or spread-spectrum methods. For a transmission of an information bandwidth of for example 100 MHz for example 32 or 64 channels of a local coil a 4096 QAM modulation with 4096 different phase amplitude combinations may be used for example. There may be intermediate storage in a buffer before the transmission, in order to be able to compensate for and correct faults and interruptions by a correction method.

The local coil includes one or more first resonant antennas 54, that have a signal connection to the data transmission device, so that the magnetic resonance data from the data transmission device are essentially mismatched. For mismatching what has already been stated for the third resonant antenna or antennas 63 applies. Here too what is achieved by the mismatch is that the signal of the data transmission device is predominantly stored in a near field instead of being emitted as a skywave.

The data transmission device requires a supply of energy for operation, that is done by an energy supply device 53. The energy supply device obtains the energy via the second resonant antenna 55, when the energy supply device is located in then near field of the third resonant antenna 63. An alternating current is induced in the second resonant antenna, that is rectified by a rectifier, for example a diode, and is smoothed by a capacitor. A voltage converter may keep the supply voltage of the data transmission device 52.

In order to safeguard an energy supply, even if the local coil is moved and the second resonant antenna 55 briefly leaves the near field of the third resonant antenna 63, the energy supply device 53 may have an energy store. The capacitor for smoothing may have a very large capacitance value, for example to be what is referred to as a supercapacitor. Also possible would be a rechargeable battery such as a Lithium cell, that is charged and discharged via a charge regulator. The voltage regulator is a step-up converter, that even for a low voltage of the capacitor, is in a position to keep a higher output voltage constant.

To safeguard the energy supply there is further provision for the local coil 50 and/or the antenna unit 60 to each have a plurality of second resonant antennas 55 and third resonant antennas 63, that are arranged distributed along an axis or over a surface, so that for a movement of the local coil, for example for a movement of the patient and arrangement of the antenna units as per application, there is always a second resonant antenna 55 arranged in the near field of a third resonant antenna 63 in each case.

The same applies for the transmission of the magnetic resonance signals by the first resonant antennas 54 and/or the fourth resonant antennas 64.

Figure 3:
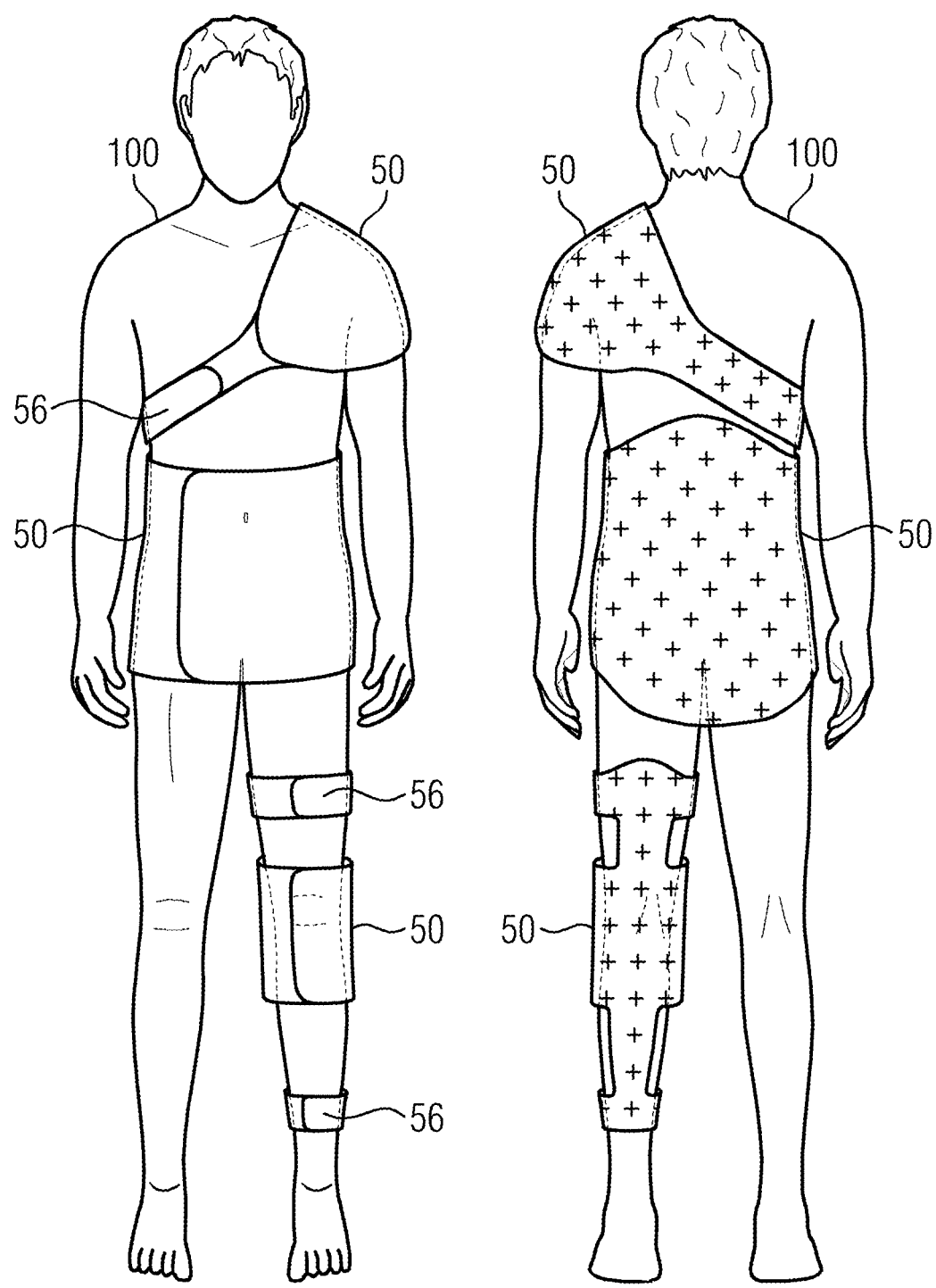
FIG. 3 depicts examples for local coils, that may be arranged on a shoulder, knee or abdomen according to an embodiment.

In this regard FIG. 3 specifies examples for local antennas 50, that may be arranged on a shoulder, knee or abdomen.

Positions of first resonant antennas 54 and second resonant antennas 55 are indicated in this figure by small crosses. The antenna coils 51 for receiving magnetic resonance signals from the body of the patient 100 may be arranged at any given points of the local coil 50, so that the antenna coils 51 acquire signals from the entire volume to be examined. A signal connection must merely exist between the antenna coils 51 and the data transmission device 52, so that the magnetic resonance signals may be prepared and transmitted to the magnetic resonance tomography unit 1. An example of a spatially separated arrangement of antenna coil 51 and first resonant antennas 54 and second resonant antennas 55 is depicted in FIG. 6.

Figure 4:
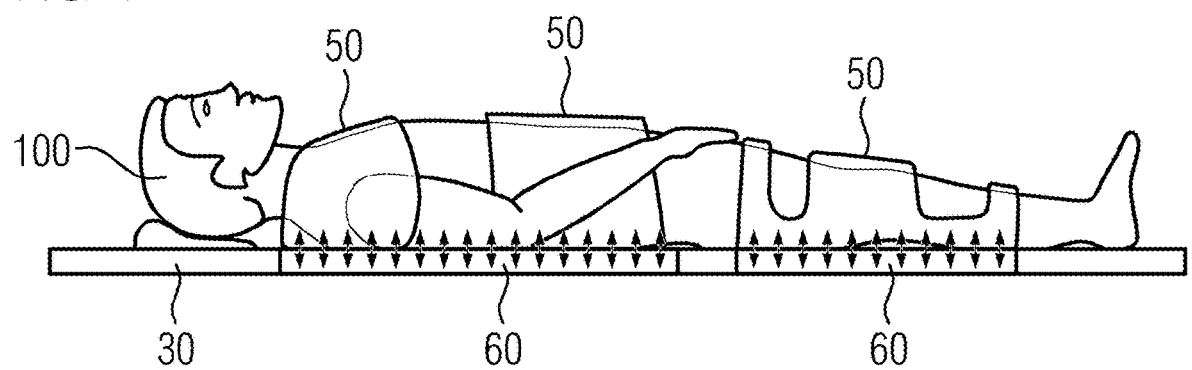
FIG. 4 depicts an example of an arrangement for one or more local coils and an antenna unit according to an embodiment.

FIG. 4 depicts an example of an arrangement for one or more local coils 50 and an antenna unit 60, as is provided for in a use of the local coil 50.

The first resonant antennas 54 and second resonant antennas 55 are arranged in an envelope of the local coil 50 in such a way that, when the local coil 50 is being used correctly, the first resonant antennas 54 and second resonant antennas 55 are arranged as close as possible to a corresponding third resonant antenna 63 or fourth resonant antenna 64. With a local coil 50, that for example lies below the patient 100 like a spine coil, the second resonant antennas 55 are arranged on the underside of the envelope of the local coil 50, so that the second resonant antennas 55 lie as close as possible to the third resonant antennas 63 of an antenna unit 60, that is arranged in a patient couch 30 for example.

The local coil 50 may feature a part of the first envelope 57 or second envelope that is remote from the first envelope with the antenna coils 51 for the magnetic resonance signal and includes an electrical connection to the latter. The second envelope may for example also be an attachment element such as a loop 56 or strap of the local coil 50, with which is attached to the patient. The first resonant antennas 54 and/or the second resonant antennas 55 are then arranged in the second envelope, so that then the first resonant antennas 54 and/or the second resonant antennas 55 are even in the near field of the third resonant antennas 63 and/or of the fourth resonant antennas 64 if the local coil 50 with the antenna coils 51 are arranged on the body of the patient 100.

Figure 5:
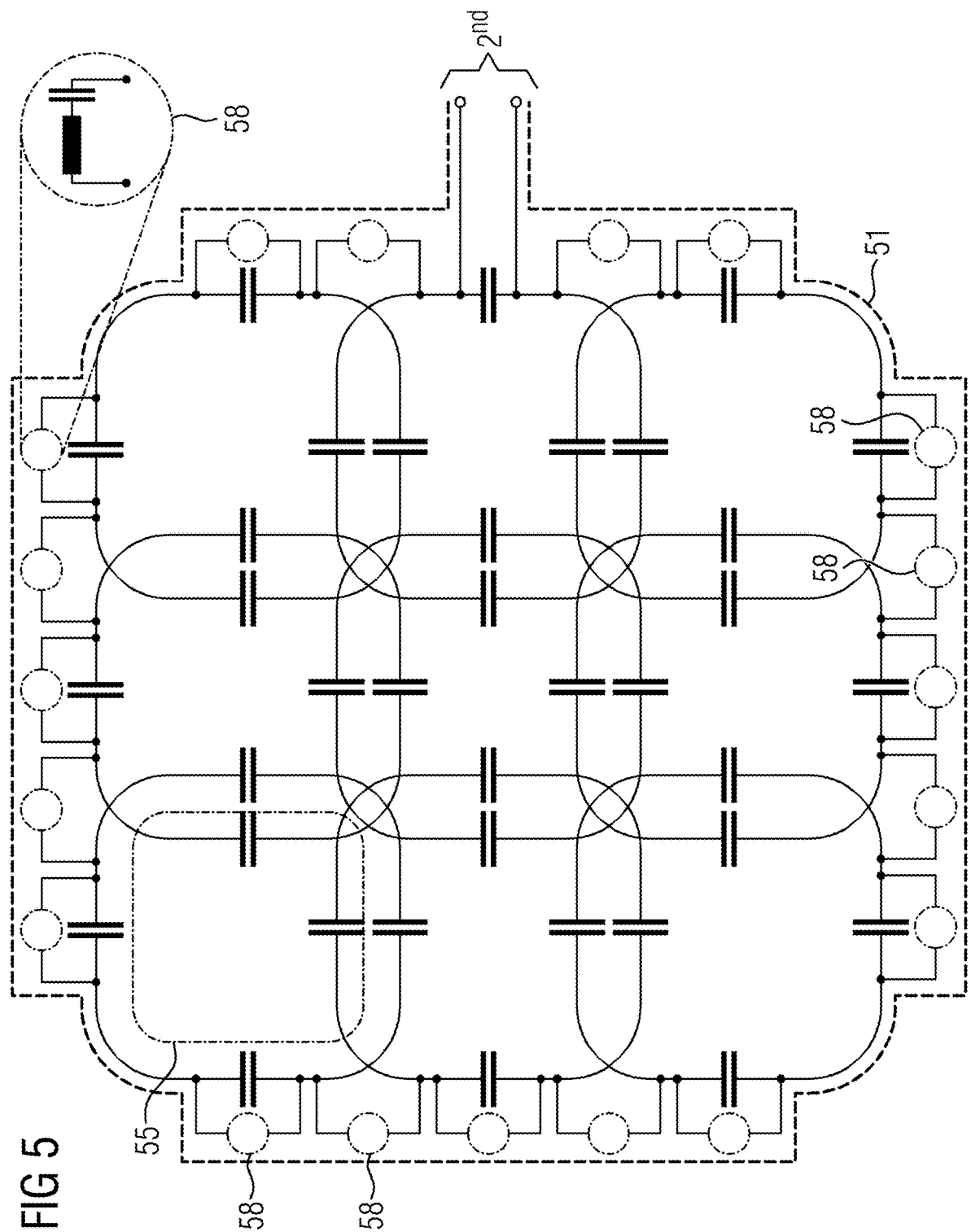
FIG. 5 depicts an example of a form of embodiment of a double-resonance antenna.

FIG. 5 depicts an example of a form of embodiment of a double-resonant antenna. The double-resonant antenna includes a plurality of smaller antenna loops, with the course indicated by way of example for a loop by the line with the dotted and dashed pattern, that may be used for example as a second resonant antenna 55 for energy transmission or as first resonant antenna 54 for data transmission. The length of the antenna loop is extended electrically by lengthening capacitors.

At the same time the outer conductor sections form the outer conductor sections of the smaller antenna loops, as indicated by the dashed line, an antenna coil 51 for recording magnetic resonance signals from the body of the patient 100. The individual conductor sections are connected by resonance elements 58, e.g. as a series resonant circuit, that are resonant at the Larmor frequency of the magnetic resonance tomography unit. Corresponding resonance elements 58 also bridge over the lengthening capacitors.

The functions of the first resonant antenna 54 for data transmission and the second resonant antenna 55 for energy transmission may be combined in one double-resonant antenna in this way or to combine all three types of antenna of the local coil 50 in a triple-resonant antenna according to the same principle.

FIG. 6 depicts an example in which the antenna coil 51 and the first resonant antenna 54 and the second resonant antenna 55 are spatially separated. The figure depicts a local coil for the abdomen schematically in cross-section. The local coil 50 is arranged on the abdominal wall of the patient 100. Located in the first envelope are the antenna coils 51 for receiving the magnetic resonance signals, the data transmission device 52 and the energy supply device 53. Loops 56 extend around the patient to the side as attachment elements, that are closed for example by Velcro fastenings. Located in the loop 56 on the underside of the patient 100 are first resonant antennas 54 and a second resonant antenna 55, that are linked via electrical connections to the data transmission device 52 or the energy supply device 53. The loop 56 thus forms a second envelope, in which the first resonant antennas 54 and the second resonant antennas 55 are arranged. In this way the first resonant antenna 54 and die second resonant antenna 55 are in the near field of a third resonant antenna 63 or fourth resonant antenna 64, when the patient 100, as depicted in FIG. 2 and FIG. 4 is lying on the patient couch 30 in accordance with the application.

The sensor for an EKG may be arranged in the same way. Instead of the antenna coil 51 however there are then electrodes for detecting the muscle potentials of the heart. A breathing sensor, that for example detects the breathing rhythm during an expansion when breathing, may be embodied in the same way.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A sensor for use in a magnetic resonance tomography unit, the sensor comprising:
   an energy supply device;
   a data transmission device; and
   a first resonant antenna configured with a signal connection to the data transmission device, the energy supply device, or data transmission device and the energy supply device;
   wherein there is a significant mismatch between an impedance of the signal connection and an impedance of the first resonant antenna in free space at a first resonant frequency of the first resonant antenna.

2. The sensor of claim 1, further comprising:
   a second resonant antenna;
   wherein the first resonant antenna includes a signal connection to the energy supply device and the second resonant antenna includes a signal connection to the data transmission device;

wherein first resonant frequencies of the first resonant antenna differ significantly from the second resonant frequency of the second resonant antenna;
wherein there is a significant mismatch between the impedance of the signal connection and an impedance of the second resonant antenna at the second resonant frequency.

3. The sensor of claim 1, wherein the first resonant antenna includes a signal connection to the energy supply device and to the data transmission device, wherein the first resonant antenna includes a first resonant frequency and a second resonant frequency different therefrom, wherein there is a significant mismatch between the impedance of the signal connection and the impedance of the first resonant antenna at the first resonant frequency and the second resonant frequency.

4. The sensor of claim 1, wherein the data transmission device is configured to modulate energy obtained from the first resonant antenna.

5. The sensor of claim 2, further comprising:
a first envelope;
wherein and the first resonant antenna, the second resonant antenna, or the first resonant antenna and the second resonant antenna is arranged adjacent to the first envelope on a side of the sensor that, when the sensor is operating, is facing away from a patient.

6. The sensor of claim 5, further comprising:
a second envelope separated from a first envelope of the sensor that is linked by an electrical line to the first envelope and in which the first resonant antenna, the second resonant antenna, or the first resonant antenna and the second resonant antenna is arranged.

7. The sensor of claim 1, wherein the data transmission device is configured to transmit data in a frequency range above a Larmor frequency of the magnetic resonance tomography unit.

8. The sensor as claimed in claim 1, wherein the data transmission device is configured to use a multi-carrier transmission method.

9. A system comprising:
a sensor comprising:
an energy supply device;
a data transmission device;
a first resonant antenna configured with a signal connection to the data transmission device, the energy supply device, or data transmission device and the energy supply device; wherein there is a significant mismatch between an impedance of the signal connection and an impedance of the first resonant antenna in free space at a first resonant frequency of the first resonant antenna; and
a magnetic resonance tomography unit comprising:
an energy transmission device;
a data receiving device; and
a second resonant antenna, wherein the second resonant antenna includes a signal connection to the energy transmission device, the data receiving device, or the energy transmission device and the data receiving device and a second resonant frequency of the second resonant antenna matches the first resonant frequency of the first resonant antenna and without interaction between first resonant antenna and second resonant antenna, a significant mismatch between an impedance of the signal connection and the impedance of the second resonant antenna exists at a second resonant frequency.

10. The system of claim 9, wherein the third second resonant antenna is arranged in an area of the magnetic resonance tomography unit located in the immediate vicinity of the first resonant antenna.

11. The system of claim 10, wherein there are surfaces of the magnetic resonance tomography unit and an envelope of the sensor formed complementarily lying between the second resonant antenna and the first resonant antenna in such a way that a distance between the second resonant antenna and the first resonant antenna is essentially minimal.

12. The system of claim 9, wherein the system includes a plurality of first resonant antennas and second resonant antennas.

* * * * *

UNITED STATES PATENT AND TRADEMARK OFFICE
CERTIFICATE OF CORRECTION

PATENT NO. : 10,976,390 B2  
APPLICATION NO. : 16/435706  
DATED : April 13, 2021  
INVENTOR(S) : Andreas Fackelmeier et al.

Page 1 of 1

It is certified that error appears in the above-identified patent and that said Letters Patent is hereby corrected as shown below:

On the Title Page

(30) Foreign Application Priority Data:
"EP..........8177237"
Should be replaced with:
"EP.......... 18177237.7"

In the Claims

Column 14, Line 28:
"The system of claim 9, wherein the third second"
Should be replaced with:
"The system of claim 9, wherein the second"

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*